(12) United States Patent
Lin et al.

(10) Patent No.: US 7,872,279 B2
(45) Date of Patent: Jan. 18, 2011

(54) LIGHT-EMITTING DIODE PACKAGE

(75) Inventors: Shun-Tian Lin, Taipei (TW); Jyun-Wei Huang, Taipei (TW)

(73) Assignees: Advanced Connectek Inc., Taipei (TW); Tysun Inc., Taipei County (TW)

( * ) Notice: Subject to any disclaimer, the term of this patent is extended or adjusted under 35 U.S.C. 154(b) by 299 days.

(21) Appl. No.: 12/057,350

(22) Filed: Mar. 27, 2008

(65) Prior Publication Data

US 2008/0290357 A1    Nov. 27, 2008

(30) Foreign Application Priority Data

May 23, 2007    (TW) ............................... 96118292 A

(51) Int. Cl.
  *H01L 29/22* (2006.01)
(52) U.S. Cl. .................... 257/99; 257/98; 257/E33.058
(58) Field of Classification Search ................... 257/98, 257/99, E33.058
See application file for complete search history.

(56) References Cited

U.S. PATENT DOCUMENTS 7,253,447 B2 * 8/2007 Oishi et al. .................... 257/99
7,683,470 B2 * 3/2010 Lee et al. ...................... 257/687
7,683,474 B2 * 3/2010 Sidwell ........................ 257/712

* cited by examiner

*Primary Examiner*—Andy Huynh
(74) *Attorney, Agent, or Firm*—Jianq Chyun IP Office

(57) ABSTRACT

A light-emitting diode (LED) package including a carrier, a pair of conductive wire units, an LED chip, and a control circuit module is provided. The carrier has a carrying portion and a ring frame connected to the periphery of the carrying portion. The carrying portion has a dome-like upper surface and a pair of through holes. The pair of conductive wire units is disposed inside the through holes respectively, and each of the conductive wire units has a conductive wire and an insulating material encapsulating the conductive wire. The LED chip is disposed on the upper surface of the carrier and is electrically connected to the conductive wires. The control circuit module is disposed at a bottom of the carrier and is electrically connected to the conductive wires for controlling the operation of the LED chip.

15 Claims, 5 Drawing Sheets

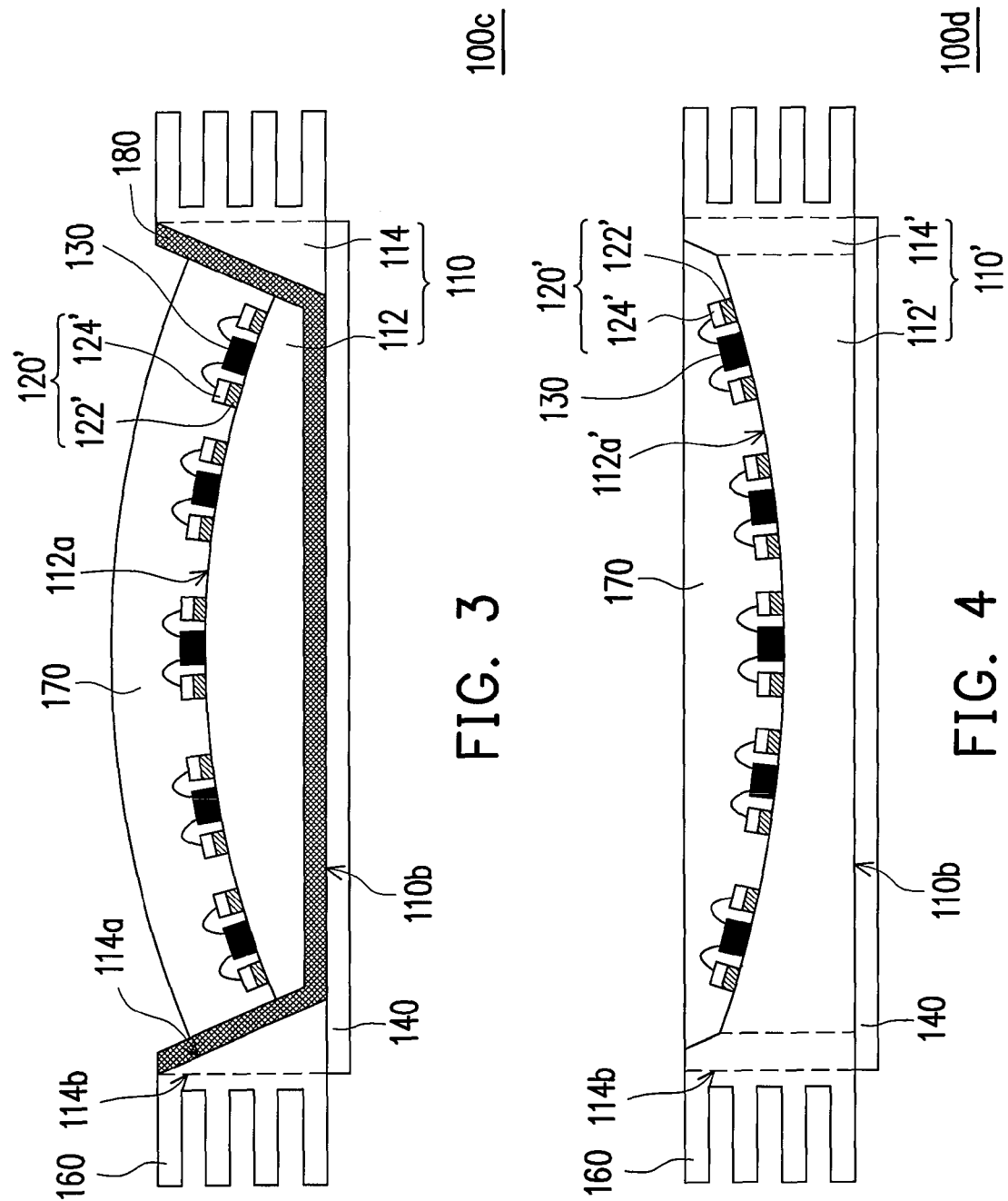

LIGHT-EMITTING DIODE PACKAGE

CROSS-REFERENCE TO RELATED APPLICATION

This application claims the priority benefit of Taiwan application serial no. 96118292, filed on May 23, 2007. The entirety the above-mentioned patent application is hereby incorporated by reference herein and made a part of specification.

BACKGROUND OF THE INVENTION

1. Field of the Invention

The present invention generally relates to a light-emitting diode (LED) package, in particular, to an LED package with a carrier having heat dissipation and optical condensing or optical diffusing functions.

2. Description of Related Art

As the luminous efficiency of light emitting diodes (LEDs) is increasingly improved, LEDs have replaced fluorescent lamps and incandescent lamps in some fields, for example, lamp sources of scanners requiring for quick response, backlight sources or front light sources of liquid crystal displays (LCDs), illumination for dashboards of automobiles, traffic lights, and common illumination devices. Compared with conventional lamps, the LEDs have absolute advantages, for example, small volume, long lifespan, low driving voltage/current, non-fragile, mercury free (no pollution), and good luminous efficiency (power saving).

However, since the optical field of a single LED is linearly emitted at a small angle substantially, the optical field pattern of a plurality of LED light sources disposed in arrays on a plane substrate generally does not meet the requirements on various applications. Therefore, according to the requirements of applications, generally, an optical lens must be added on the optical path to condense or diffuse light beams. However, the optical lens may cause secondary optical effects, such as reflection, refraction, and absorption, thus reducing the efficiency of the optical transmission. Further, the optical lens is generally sealed on the substrate hermetically, and thus the gas is remained between the optical lens and the substrate, and thus the dissipation of the heat energy generated by the LED during operation may be blocked to the outside.

Since the poor heat dissipation effect is unsatisfactory, the temperature of the LED cannot be effectively lowered, which further affects the luminous efficiency and the life time of LED lamps.

SUMMARY OF THE INVENTION

Accordingly, the present invention is directed to a light-emitting diode (LED) package adapted to a plurality of LED light sources arranged in arrays, so as to achieve a high thermal conductivity and electrical insulating property at an extremely high heat-generation power. The LED package may also have the optical condensing or optical diffusing function without using an optical lens, thereby improving the optical efficiency of the LED light source.

The present invention provides a light-emitting diode (LED) package, which includes a carrier, a pair of first conductive wire units, a first LED chip, and a control circuit module. The carrier has a carrying portion and a ring frame connected to a periphery of the carrying portion. The carrying portion has a dome-like upper surface and at least one pair of through holes. The pair of first conductive wire units is disposed inside the through holes respectively, and each of the conductive wire units has a conductive wire and an insulating material encapsulating the conductive wire. The first LED chip is disposed on the upper surface of the carrier and is electrically connected to the pair of conductive wires. The control circuit module is disposed at a bottom of the carrier and is electrically connected to the pair of conductive wires for controlling an operation of the LED chip.

In an embodiment of the present invention, the upper surface of the carrying portion is a dome-like surface raised upwardly or depressed downwardly.

In an embodiment of the present invention, a material of the carrier is one selected from a group consisting of copper, aluminium, copper-based alloy or composite material, aluminium-based alloy or composite material, aluminium nitride, and aluminium oxide.

In an embodiment of the present invention, the LED package further includes a reflective film disposed on an inner surface of the ring frame.

In an embodiment of the present invention, the LED package further includes a plurality of cooling fins disposed on an outer surface of the ring frame.

In an embodiment of the present invention, the first LED chip is electrically connected to the pair of conductive wires by means of wire bonding technique or flip-chip bonding technique.

In an embodiment of the present invention, the LED package further includes a second LED chip and a pair of second conductive wire units. The second LED chip is disposed on an upper surface of the carrier. Each of the second conductive wire units includes an electrical insulating layer disposed on the carrying portion and a conductive wire layer disposed on the electrical insulating layer. The conductive wire layers and the LED chips and the control circuit module are electrically connected.

In an embodiment of the present invention, the second LED chip is electrically connected to the conductive wire layers by a wire bonding technique. Further, the LED package further includes a molding compound disposed on the carrying portion for encapsulating the first LED chip and the second LED chip.

In an embodiment of the present invention, the LED package further includes a molding compound disposed on the carrying portion for encapsulating the first LED chip.

The present invention further provides a light-emitting diode (LED) package, which includes a carrier, a pair of conductive wire units, an LED chip, and a control circuit module. The carrier has a carrying portion and a ring frame connected to a periphery of the carrying portion. The carrying portion has a dome-like upper surface. Each of the conductive wire units includes an electrical insulating layer disposed on the carrying portion and a conductive wire layer disposed on the electrical insulating layer. The LED chip is disposed on the upper surface of the carrier and is electrically connected to the conductive wire layers. The control circuit module is electrically connected to the conductive wire layers for controlling an operation of the LED chip.

In an embodiment of the present invention, the upper surface of the carrying portion is a dome-like surface raised upwardly or depressed downwardly.

In an embodiment of the present invention, a material of the carrier is one selected from a group consisting of copper, aluminium, copper-based alloy or composite material, aluminium-based alloy or composite material, aluminium nitride, and aluminium oxide.

In an embodiment of the present invention, the LED package further includes a reflective film disposed on an inner surface of the ring frame.

In an embodiment of the present invention, the LED package further includes a plurality of cooling fins disposed on an outer surface of the ring frame.

In an embodiment of the present invention, the LED package further includes a heat pipe disposed on a bottom surface of the carrying portion and an inner surface of the ring frame.

In an embodiment of the present invention, the LED chip is electrically connected to the conductive wire layers by a wire bonding technique.

In an embodiment of the present invention, the LED package further includes a molding compound disposed on the carrier for encapsulating the LED chip.

The LED package of the present invention directly packages the LED chip on a carrier having heat conducting function, and thus the heat energy generated by the LED chip during operation is carried away by the carrier, thereby improving the heat dissipation efficiency. Further, the carrying portion of the carrier is designed to be a dome-like upper surface raised upwardly or depressed downwardly, such that the carrier has heat dissipation and optical diffusing or optical condensing functions. Thus, the LED package can also have the optical diffusing or optical condensing function without using an optical lens.

In order to make the features and advantages of the present invention clearer and more understandable, the following embodiments are illustrated in detail with reference to the appended drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3 is a schematic cross-sectional view of an LED package according to a third embodiment of the present invention.

FIG. 4 is a schematic cross-sectional view of an LED package according to a fourth embodiment of the present invention.

DESCRIPTION OF THE EMBODIMENTS

Figure 1A:
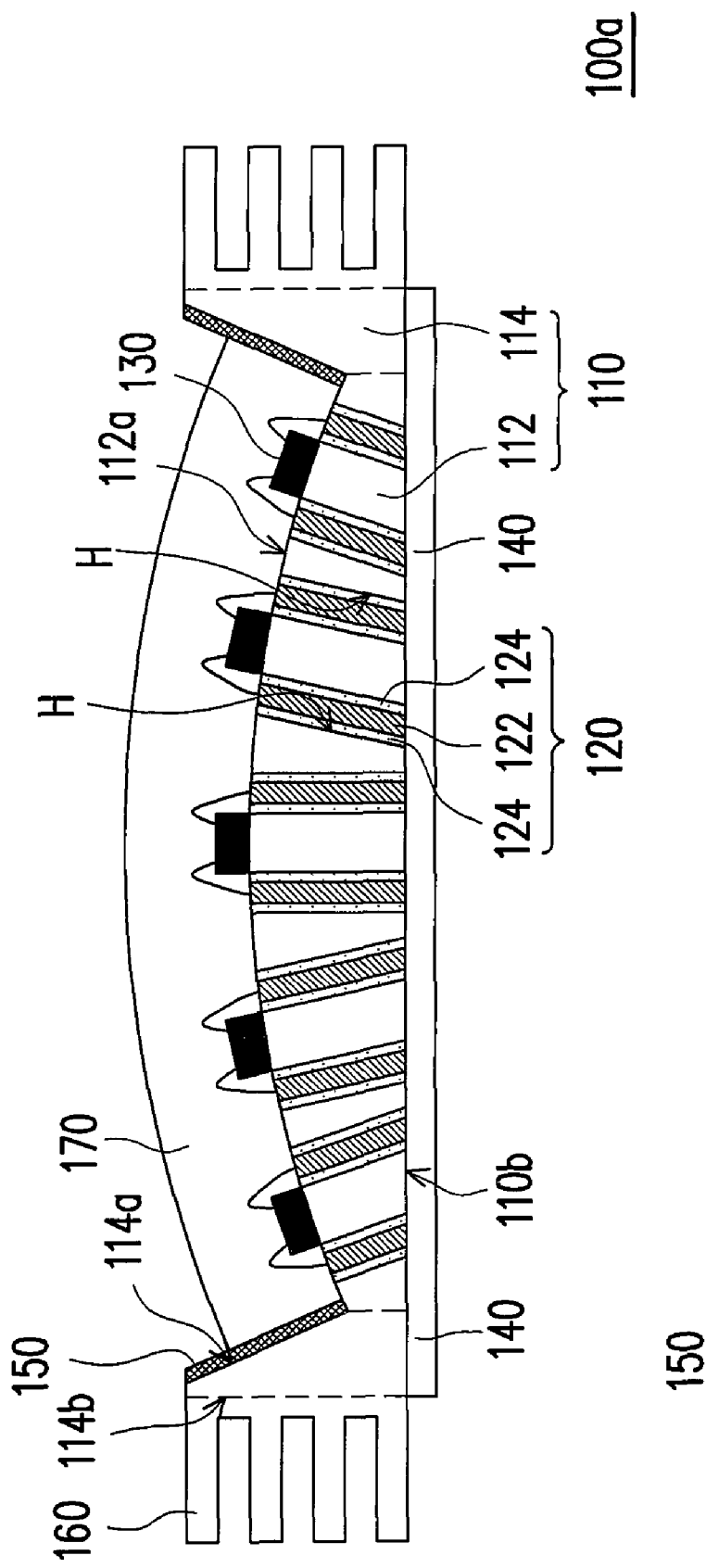
FIGS. 1A and 1B are a schematic cross-sectional view and a schematic top view of an LED package according to a first embodiment of the present invention respectively.

Reference will now be made in detail to the present embodiments of the invention, examples of which are illustrated in the accompanying drawings. Wherever possible, the same reference numbers are used in the drawings and the description to refer to the same or like parts.

Figure 1B:
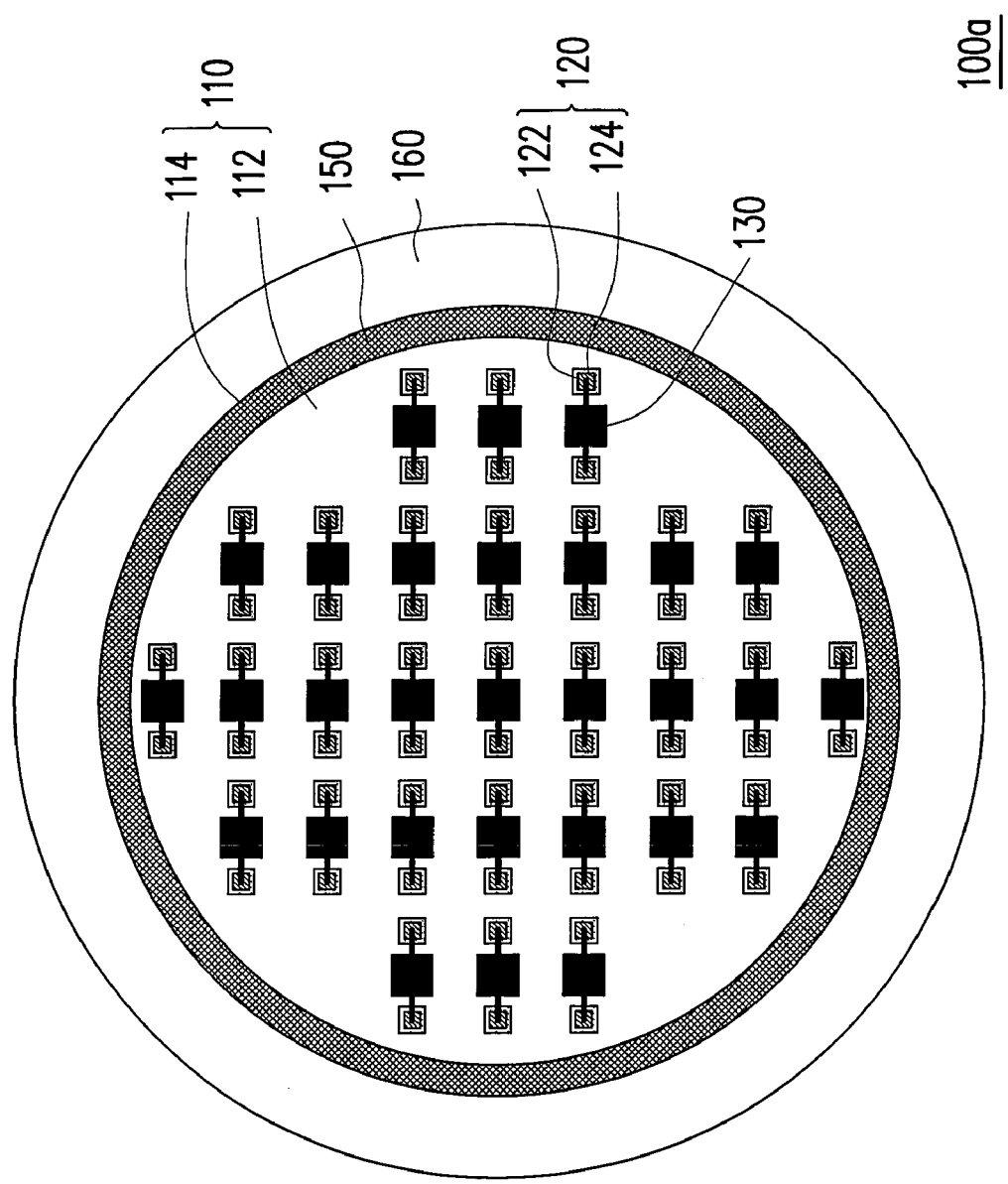

FIGS. 1A and 1B are a schematic cross-sectional view and a schematic top view of an LED package according to a first embodiment of the present invention respectively. Referring to FIGS. 1A and 1B together, an LED package 100a mainly includes a carrier 110, a plurality of pairs of conductive wire units 120, a plurality of LED chips 130, and a control circuit module 140. In this embodiment, a plurality of pairs of conductive wire units 120 and the plurality of the LED chips 130 disposed in the LED package 100a are taken as an example for illustration. However, users can also dispose a pair of conductive wire units 120 and an LED chip 130 in the LED package 100a according to different application requirements. The number of the pairs of the conductive wire units 120 and the LED chips 130 are not limited in the present invention.

The carrier 110 has a carrying portion 112 and a ring frame 114 connected to a periphery of the carrying portion 112. Further, the carrying portion 112 has a dome-like upper surface 112a and pairs of through holes H. In this embodiment, the upper surface 112a of the carrying portion 112 is a dome-like surface raised upwardly, thus having the optical diffusing function. Further, in order to make the carrier 110 effectively carry away the heat energy generated by the LED chip 130 during operation, a material of the carrier 110 may be selected from a group consisting of copper, aluminium, copper-based alloy or composite material, aluminium-based alloy or composite material, aluminium nitride, and aluminium oxide.

The pairs of conductive wire units 120 are disposed in the pairs of through holes H, and each of the conductive wire units 120 includes a conductive wire 122 and an insulating material 124 covering the conductive wire 122. The LED chips 130 are disposed on the upper surface 112a of the carrier 110 and are electrically connected to the corresponding conductive wires 122. In this embodiment, the LED chips 130 are electrically connected to the conductive wires 122 by means of wire bonding technique. However, the LED chips 130 may also be electrically connected to the conductive wires 122 by a flip-chip bonding technique or other methods, which is not limited in the present invention. The control circuit module 140 is disposed at a bottom 100 of the carrier 110 and is electrically connected to the pairs of conductive wires 122 to control the operation of the LED chips 130.

As shown in FIGS. 1A and 1B, the LED package 100a may further include a reflective film 150 disposed on an inner surface 114a of the ring frame 114. The reflective film 150 may be made of a metal having a high reflective index to improve the reflection efficiency of the carrier 110. Further, in order to improve the heat dissipation efficiency of the carrier 110, the LED package 10a may further include a plurality of cooling fins 160 disposed on an outer surface 114b of the ring frame 114 to increase the heat dissipation area. Furthermore, the LED package 100a may further include a molding compound 170 disposed on the carrier 110. The molding compound 170 encapsulates the LED chips 130 to prevent damaging or humidity getting into the LED chips 130.

Figure 2:
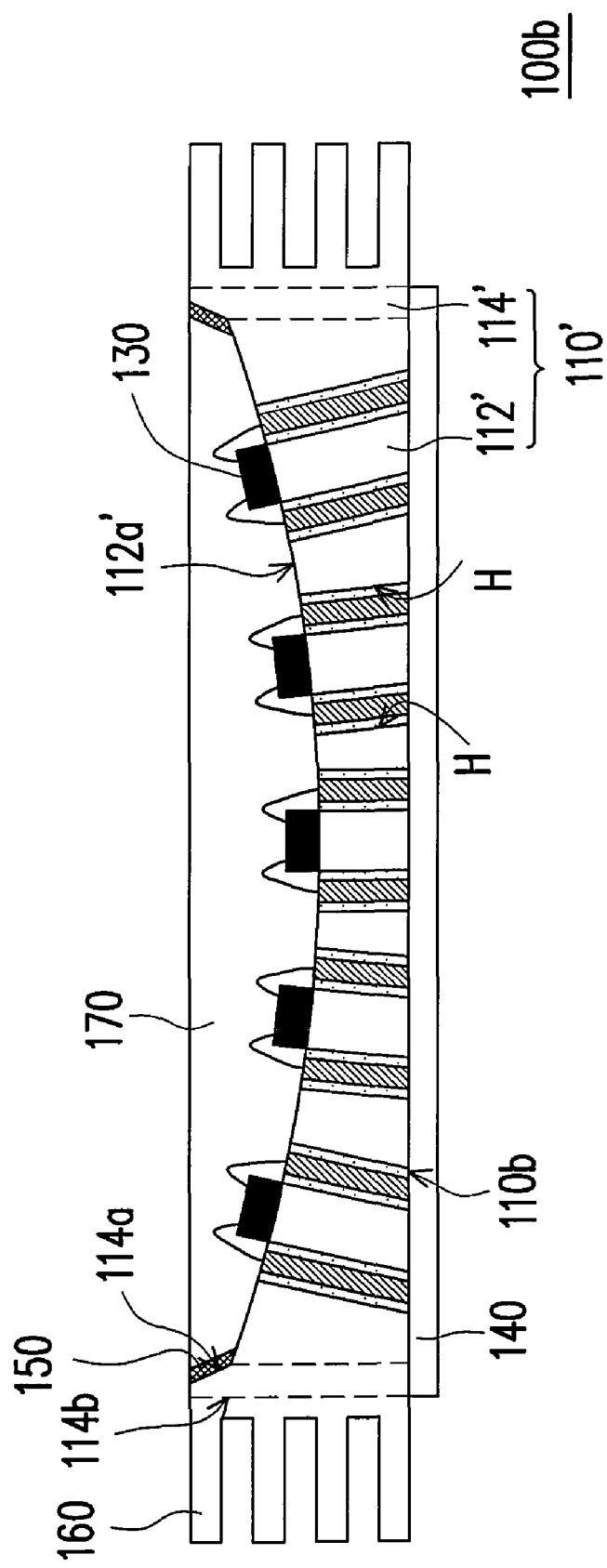
FIG. 2 is a schematic cross-sectional view of an LED package according to a second embodiment of the present invention.

FIG. 2 is a schematic cross-sectional view of an LED package according to a second embodiment of the present invention. Referring to FIG. 2, an LED package 100b is substantially the same as the LED package 100a in FIG. 1A, and the difference therebetween is described as follows. The upper surface 112a' of the carrying portion 112' of the carrier 110' is a dome-like surface depressed downwardly, thus having the optical condensing function. Therefore, users can adopts the carrier 110 having the optical diffusing function or the carrier 110' having the optical condensing function according to different requirements, which is not be limited in the present invention.

FIG. 3 is a schematic cross-sectional view of an LED package according to a third embodiment of the present invention. Referring to FIG. 3, an LED package 100c is substantially the same as the LED package 100a in FIG. 1A, and the difference therebetween is described as follows. The conductive wire units 120' of the LED package 100c have a laminated structure and are composed of an electrical insulating layer 122' disposed on the carrying portion 112 and a conductive wire layer 124' disposed on the electrical insulating layer 122'. Similarly, the LED chips 130 are disposed on the upper surface 112a of the carrier 112 and are electrically connected to the conductive wire layer 124'. In this embodiment, the LED chips 130 are electrically connected to the conductive wire layer 124' by a wire bonding technique. Further, in order to improve the heat dissipation efficiency of the carrier 110, the LED package 100c may further include a heat pipe 180 disposed on the bottom surface of the carrying portion 110 and the inner surface 114a of the ring frame 114.

FIG. 4 is a schematic cross-sectional view of an LED package according to a fourth embodiment of the present invention. Referring to FIG. 4, an LED package 100d is substantially the same as the LED package 100c in FIG. 3, and the difference therebetween is described as follows. The upper surface 112a' of the carrying portion 112' adopted in the LED package 100d is a dome-like surface depressed downwardly, thus having the optical condensing function. Therefore, the users can adopt the carrier 110 having the optical diffusing function or the carrier 110' having the optical condensing function according to requirements, which is not be limited in the present invention.

Figure 5:
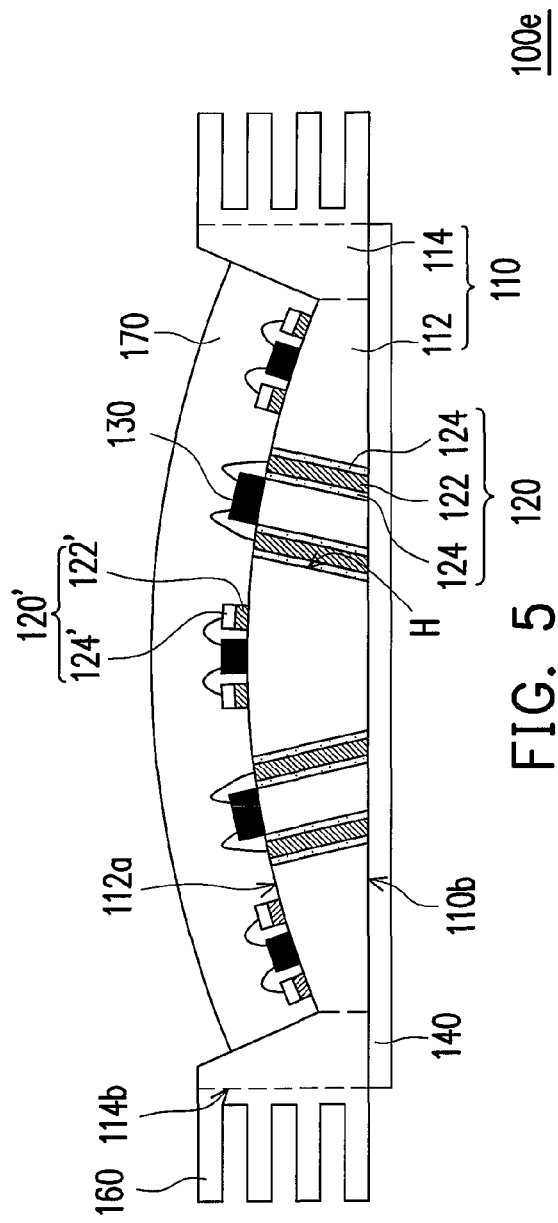
FIG. 5 is a schematic cross-sectional view of an LED package according to a fifth embodiment of the present invention.

FIG. 5 is a schematic cross-sectional view of an LED package according to a fifth embodiment of the present invention. Referring to FIG. 5, users may adopt the two different conductive wire units 120 and 120' as shown in the FIGS. 1A and 3 in the LED package 100e at the same time, thus the LED chips 130 are electrically connected to the control circuit module 140 through the conductive wire units 120 or 120'.

Figure 6:
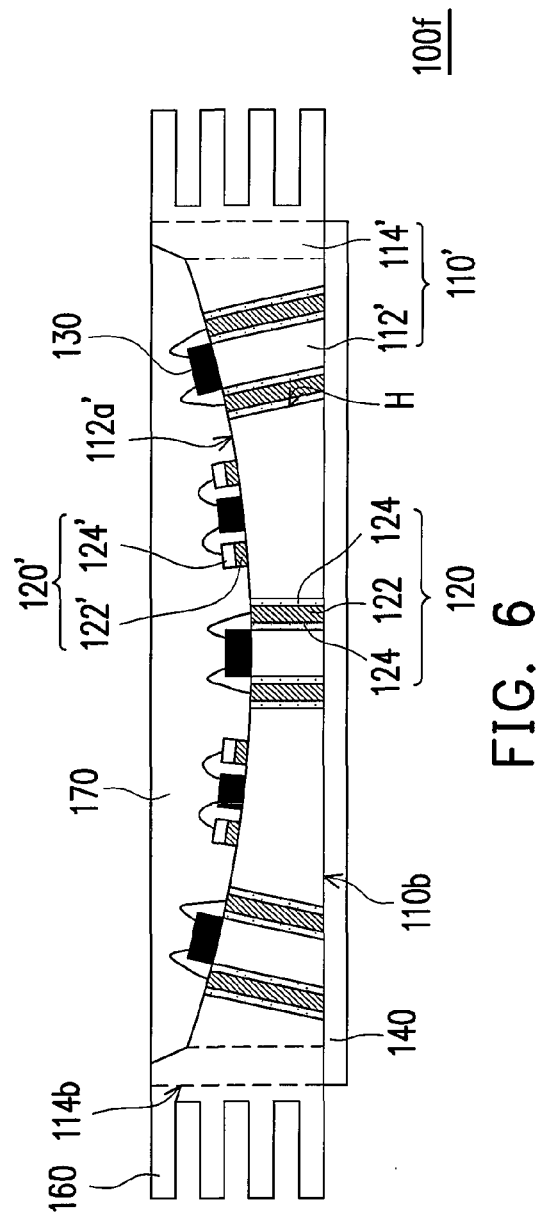
FIG. 6 is a schematic cross-sectional view of an LED package according to a sixth embodiment of the present invention.

FIG. 6 is a schematic cross-sectional view of an LED package according to a sixth embodiment of the present invention. Referring to FIG. 6, an LED package 100f is substantially the same as the LED package 100e in FIG. 5, and the difference therebetween is described as follows. The upper surface 112a' of the carrying portion 112' adopted by the LED package 100f is a dome-like surface depressed downwardly, thus having the optical condensing function. Therefore, the users may adopt the carrier 110 having the optical diffusing function or the carrier 110' having the optical condensing function according to requirements, which is not be limited in the present invention.

In view of the above, the LED package of the present invention directly packages the LED chips on a carrier having the thermal conducting function. Also, the dome-like upper surface raised upwardly or depressed downwardly of the carrying portion is adopted, such that the carrier has the heat dissipation and optical diffusing or optical condensing functions. As such, the LED package can have the optical diffusing or optical condensing function without using an optical lens. Further, the thermal energy generated by the LED chip during operation can be directly discharged from the bottom or sides of the carrier, so as to avoid the problem that the heat energy cannot be dissipated to the outside since the optical lens is packaged on the substrate in prior art.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) package, comprising:
   a carrier, comprising a carrying portion and a ring frame connected to a periphery of the carrying portion, wherein the carrying portion comprises a dome-like upper surface;
   a first LED chip, disposed on the upper surface of the carrier; and
   a pair of first conductive wire units, one of the pair of the first conductive wire units disposed at one side of the first LED chip while the other of the pair of the first conductive wire units disposed at an opposite side of the first LED chip, and the first LED chip electrically connected to the first conductive wire units; and
   a control circuit module, disposed at a bottom of the carrier, and electrically connected to the first conductive wire units, for controlling an operation of the first LED chip.

2. The LED package according to claim 1, wherein the upper surface of the carrier is a dome-like surface raised upwardly or depressed downwardly.

3. The LED package according to claim 1, wherein a material of the carrier is selected from a group consisting of copper, aluminium, copper-based alloy or composite material, aluminium-based alloy or composite material, aluminium nitride, and aluminium oxide.

4. The LED package according to claim 1, further comprising a reflective film disposed on an inner surface of the ring frame.

5. The LED package according to claim 1, further comprising a plurality of cooling fins disposed on an outer surface of the ring frame.

6. The LED package according to claim 1, wherein the first LED chip is electrically connected to the first conductive wire units by a wire bonding or flip-chip bonding technique.

7. The LED package according to claim 1, further comprising:
   a second LED chip, disposed on the upper surface of the carrier; and
   a pair of second conductive wire units, wherein each of the second conductive wire units comprises an electrical insulating layer disposed on the carrier and a conductive wire layer disposed on the electrical insulating layer, and the conductive wire layers are electrically connected to the second LED chip and the control circuit module.

8. The LED package according to claim 7, wherein the second LED chip is electrically connected to the conductive wire layers by a wire bonding technique.

9. The LED package according to claim 7, further comprising a molding compound disposed on the carrier, for encapsulating the first LED chip and the second LED chip.

10. The LED package according to claim 1, further comprising a molding compound disposed on the carrier, for encapsulating the first LED chip.

11. The LED package according to claim 1, wherein the carrier comprises at least one pair of through holes located at opposite sides of the first LED chip, and the pair of first conductive wire units are disposed inside the through holes respectively.

12. The LED package according to claim 11, wherein each of the first conductive wire units comprises a conductive wire and an insulating material encapsulating the conductive wire.

13. The LED package according to claim 1, wherein each of the first conductive wire units comprises an electrical insulating layer disposed on the carrier and a conductive wire layer disposed on the electrical insulating layer.

14. The LED package according to claim 13, further comprising a heat pipe disposed on a bottom surface of the carrier and an inner surface of the ring frame.

15. The LED package according to claim 13, wherein the first LED chip is electrically connected to the conductive wire layers by a wire bonding technique.

* * * * *